United States Patent [19]

Su et al.

[11] Patent Number: 5,108,026
[45] Date of Patent: Apr. 28, 1992

[54] EUTECTIC BONDING OF METAL TO CERAMIC

[75] Inventors: Ming-Yih Su; John W. Somers, both of Albuquerque, N. Mex.

[73] Assignee: Motorola Inc., Schaumburg, Ill.

[21] Appl. No.: 699,534

[22] Filed: May 14, 1991

[51] Int. Cl.$^5$ .................... B23K 31/02; B23K 35/36
[52] U.S. Cl. .................... 228/122; 228/263.12; 228/198
[58] Field of Search .................... 228/122, 263.12, 903, 228/121, 124, 198

[56] References Cited

U.S. PATENT DOCUMENTS

| 3,744,120 | 7/1973 | Burgess et al. | 228/198 |
| 3,911,553 | 10/1975 | Burgess et al. | 228/903 |
| 4,505,418 | 3/1985 | Neidig et al. | 228/122 |
| 4,603,474 | 8/1986 | Gobrecht et al. | 228/122 |
| 4,764,341 | 8/1988 | Flaitz et al. | 228/122 |

FOREIGN PATENT DOCUMENTS 545179  8/1957  Canada ................. 228/124

OTHER PUBLICATIONS

Holowczak, J. E., et al "Effect of Alumina Composition on Interfacial Chemistry and Strength of Direct Bonded Copper-Alumina", Ceram. Eng. Sci. Proc., vol. 10 (9-10) (1989) pp. 1283-1294.

Primary Examiner—Richard K. Seidel
Assistant Examiner—Jeffrey T. Knapp
Attorney, Agent, or Firm—Douglas D. Fekete

[57] ABSTRACT

An improved eutectic oxide bonding method is applied for bonding a metallic copper foil to a nonmetallic substrate by forming a liquid phase derived from a eutectic oxide composition. A metallic copper thin film is initially deposited onto the substrate and heated in a low oxygen atmosphere under suitable conditions to form a cuprous oxide film. A metallic copper foil is positioned on the substrate in contact with the cuprous oxide film. Preferably, the assembly is initially heated at a temperature below the eutectic melting point to soften the foil and promote intimate contact between the foil and the cuprous oxide film. Thereafter, the assembly is heated above the eutectic melting point to form a liquid phase at the interface of the foil and the cuprous oxide film, and maintained at the temperature for a time sufficient to dissolve the oxide film, whereupon the liquid phase wets the substrate. The assembly is cooled, and the liquid phase is solidified to bond the foil to the substrate. In addition to copper, the method may be adopted to bond foils of other metals, including chromium, iron, cobalt and nickel, using low melting eutectic oxides thereof.

6 Claims, 1 Drawing Sheet

5,108,026

EUTECTIC BONDING OF METAL TO CERAMIC

BACKGROUND OF THE INVENTION

This invention relates to a method for bonding a metal foil to a ceramic substrate. More particularly, this invention relates to such method utilizing, as a bonding agent, a eutectic composition of the metal and its oxide that is derived from an oxide film that is preformed onto the substrate prior to application of the foil. In one aspect of this invention, a copper foil is bonded to a ceramic substrate utilizing a preformed cuprous oxide layer.

In the manufacture of electronic components and the like, it is known to bond a copper foil to a ceramic substrate using a eutectic bonding agent. For this purpose, the surface of the copper foil is initially oxidized by heating in a atmosphere having a controlled low oxygen content to form a layer of cuprous oxide compound, $Cu_2O$. In appropriate proportions, copper and cuprous oxide form a low melting eutectic oxide mixture containing 0.34 weight percent oxygen and having a melting point of about 1065° C., significantly less than metallic copper. The foil is placed with the cuprous oxide film lying against the substrate. The arrangement is heated above the eutectic melting point, whereupon incipient melting occurs between the copper metal and the cuprous oxide to form a eutectic liquid phase. This continues until the cuprous oxide is consumed. The resulting liquid phase wets the ceramic surface and, upon cooling, resolidifies to bond the copper foil to the substrate.

Although this eutectic bonding method has been generally satisfactory in forming a tight bond between the metal foil and the nonmetallic substrate, it nevertheless suffers from several deficiencies. Oxidation of the foil must be controlled not only to form the desired cuprous oxide compound, as opposed to the greater oxidized cupric oxide, CuO, but to limit the thickness of the film to a few Angstroms so as not to jeopardize the desired metallic properties of the bulk of the foil. The oxidized film needs to be suitably thick to produce sufficient liquid phase to assure wetting of the surface that is essential to forming a strong bond. On the other hand, a film that is too thick produces excess liquid phase, which consumes a greater proportion of the metal foil and tends to spread onto unwanted regions. Difficulty also arises in positioning the foil with the oxide film accurately against the prescribed region, which is particularly significant for foils having complex configurations such a lines of an electrical circuit. Thus, there remains a need for an improved method for eutectic oxide bonding of copper or other metal foil to a nonmetallic substrate.

SUMMARY OF THE INVENTION

In a preferred embodiment, the eutectic oxide bonding method of this invention is utilized to bond a metallic copper foil to a ceramic substrate and includes preforming a cuprous oxide film on the substrate prior to applying the metallic copper foil. Initially, a metallic copper thin film is vapor deposited onto the substrate. The substrate with the copper film is then heated in contact with an atmosphere having a controlled low oxygen content under conditions sufficient to oxidize the copper to form cuprous oxide compound. In general, the copper layer is heated at a temperature between 800° C. and 1065° C., the latter temperature corresponding to the eutectic melting point, and preferably between 900° C. and 1000° C. Oxygen partial pressure is preferably less than $10^{-3}$ atmosphere. Oxidation is continued until the copper has been substantially reacted to form an oxide film that is essentially free of elemental copper.

Following formation of the cuprous oxide film, a metallic copper foil is arranged with the substrate such that the foil lies directly onto the oxide film. The foil preferably features unoxidized surfaces. The arrangement is heated initially at a temperature less than the eutectic melting point to soften the metallic copper foil and produce intimate contact at the interface the foil and the cuprous oxide film. Thereafter, the arrangement is further heated above the eutectic melting point, but below the copper metal melting point. At this temperature, a liquid phase of the copper-cuprous oxide eutectic composition forms at the interface. Thereafter, additional copper and cuprous oxide dissolves into the liquid phase until the oxide film is consumed, whereupon the resulting liquid wets the ceramic surface. The arrangement is then cooled, whereupon the eutectic solidifies to bond the foil to the substrate.

It is a significant feature of the method of this invention that the cuprous oxide film is formed directly on the substrate from an initial copper deposit and separate from the copper foil. Copper deposition is readily controlled to limit the deposit, for example, using a mask, to a desired region of the substrate, and also to limit the amount of copper to produce a film having a predetermined thickness. The oxidation reaction is carried out to achieve substantially complete reaction of the deposit, without risk of over-reaction that would diminish the foil and produce excessive liquid. When the foil is heated overlying the oxide deposit, the portion of the foil that is consumed in forming the eutectic bonding agent is limited by the size of the deposit, thereby not only assuring that sufficient liquid is formed to wet and bond to the substrate, but also assuring that the remainder of the foil is suitable for its intended purpose. Optimum bonding is promoted in the preferred embodiment by initially heating the copper foil to soften the metal and thereby produce intimate contact with the oxidized deposit that is conducive to liquid formation at the interface. Thus, this invention provides an improved method for eutectic bonding of the copper foil to the substrate.

BRIEF DESCRIPTION OF THE DRAWINGS

The present invention will be further illustrated with reference to the following figures.

DETAILED DESCRIPTION OF THE INVENTION

Figure 1A:
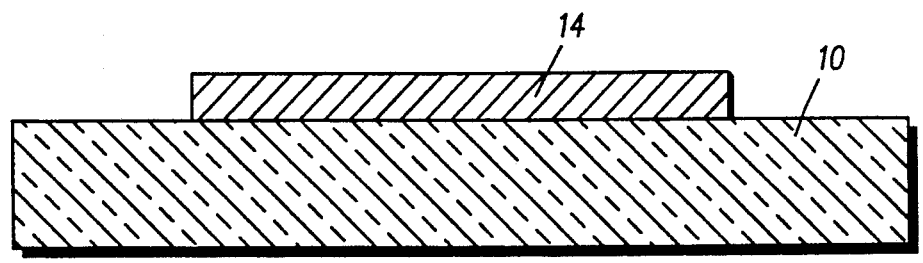
FIG. 1a through c show a cross-sectional view of a portion of a substrate following selected steps in the bonding of a copper foil thereto by the method of this invention.
Figure 1B:
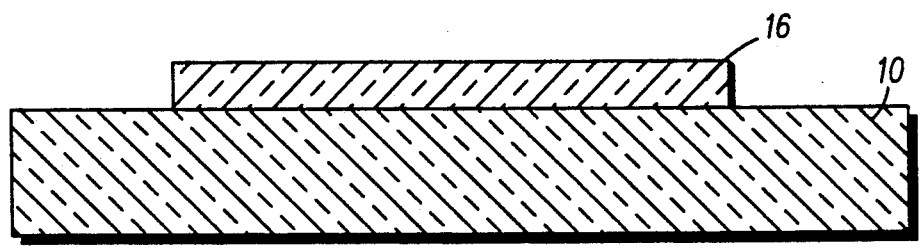
Figure 1C:
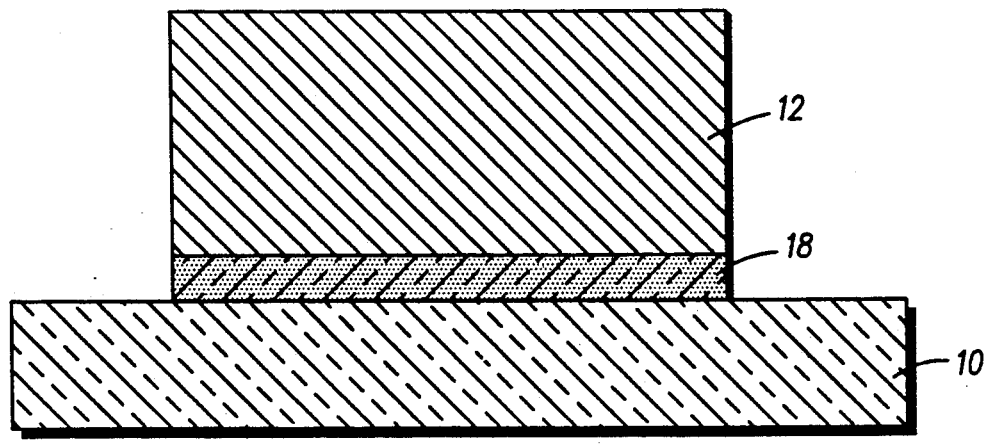

In accordance with a preferred embodiment, this invention is applied to bond a copper foil 12 to an alumina substrate 10, see FIG. 1c.

Referring to FIG. 1a, a substrate 10 formed of high purity aluminum oxide material is cleaned by immersing in a boiling acetone bath, thereafter immersing in a room temperature isopropyl alcohol bath with ultrasonic agitation, rinsing in deionized water with ultrasonic agitation, and drying in warm nitrogen gas. Using a shadow mask, copper deposits 14 are formed on the substrate by thermal evaporation. The substrate and mask are arranged within a vacuum chamber proximate to a resistive heating boat containing metallic copper. Following evacuation, the boat is heated by electrical current to a temperature sufficient to vaporize the copper, whereupon copper vapors condense onto the substrate through the openings in the mask. The resulting copper deposit 14 is about 500 Å thick.

Referring to FIG. 1b, substrate 10 bearing copper 14 is heated in an oxidizing atmosphere to form a cuprous oxide layer 16. The copper clad substrate is positioned in a tube furnace and heated to a temperature of about 900° C. while exposed to a nitrogen gas stream containing an oxygen partial pressure about $10^{-3}$ atmosphere. The substrate is heated for between 5 and 10 minutes to substantially react the metal to form the desired cuprous oxide. The substrate is removed and cooled while exposed to oxygen-free nitrogen to avoid further oxidation.

An electrolytic copper foil having a thickness of about 0.5 millimeter is then laid directly onto the cuprous oxide deposit and covered with a weighted plate to facilitate contact at the interface. The arrangement is heated in a commercial ultra high purity grade nitrogen atmosphere initially at a temperature of about 1060° C. for about 30 minutes, during which the foil softens and deforms into intimate contact with the still-solid cuprous oxide deposit. Thereafter, the temperature is raised to about 1070° C. for about 30 minutes. At the higher temperature, a liquid forms at the interface between the foil and the oxide deposit and continues to grow, consuming the oxide deposit, until reaching and wetting the substrate surface. The assembly is cooled, following which the foil 12 is tightly bonded to substrate 10 by a layer 18 of near-eutectic copper oxide composition, as shown in FIG. 1c. It is found that the bond produced in accordance with this invention is comparable to prior eutectic melting techniques. However, in contrast to methods that oxidize the copper foil surface, the metal deposition and oxidation steps in accordance with this method produces a readily controlled volume of eutectic bonding agent and limits dissolution of the metal to assure a desired foil thickness.

In the described embodiment, the method of this invention is employed to affix a copper foil to an alumina substrate. While not limited to any particular theory, the method of this invention takes advantage of the low melting point of a eutectic oxide composition composed of 0.34 weight percent oxygen and the balance copper. The eutectic melting point of about 1065° C. is significantly less than the copper melting point of about 1083° C. and substantially less than the cuprous oxide melting point. Thus, bonding is accomplished by heating to a temperature above the eutectic melting point, whereupon a eutectic liquid phase inherently forms at the interface, for a time sufficient to dissolve the entire oxide layer, whereupon the liquid phase flows into intimate contact with the substrate. Other metals including chromium, iron, cobalt, and nickel also form eutectic oxides having relatively low melting points in comparison to the metal and are suitable for bonding foil thereof to nonmetallic substrates by the method of this invention. In general, this invention is well suited to bonding foils that are between about 0.05 and 1.25 millimeters thick, and preferably between about 0.38 and 0.63 millimeters thick. In addition to alumina, this method may be utilized to affix metal films to substrates formed of other suitable nonmetallic materials, including barium titanate, neodymium titanate, aluminum nitride and silicon carbide.

The initial metal deposits for forming the oxide agent may be applied by any suitable technique including vacuum deposition, electron beam irradiation and sputtering. Alternately, the initial metal deposit may be formed by electroless deposition or electroplating techniques. In the preferred embodiment, it is desired to apply a continuous copper film onto the desired region to assure uniform bonding. In general, copper deposits greater than about 200 Å produce sufficient agent to assure a strong bond. Films greater than about 3000 Å produce excessive liquid during eutectic melting. Preferably, the copper deposit is between about 500 Å and 1000 Å.

To form the desired cuprous oxide, the copper is heated in a controlled oxygen-deficient atmosphere. The oxygen content is controlled at a low partial pressure to avoid formation of cupric oxide, CuO. The atmosphere is conveniently composed predominantly of a suitable inert gas such as nitrogen or a noble gas and containing generally less than $10^{-3}$ atmosphere oxygen partial pressure, preferably between $10^{-3}$ and $10^{-5}$ atmosphere. The desired reaction may be carried out at a temperature above about 800° C. to complete the reaction within a practical time, but not greater than 1065° C., the copper melting point. Preferred oxidation temperatures are between 900° C. and 1000° C.

Following formation of the cuprous oxide, the copper foil is applied to the oxide and heated for bonding. The method is typically applied to foils having thicknesses between 0.05 and 1.25 millimeters, preferably between 0.375 and 0.625 millimeters, substantially greater than the oxidized deposit. In the described embodiment, the arrangement is initially heated at a temperature less than the eutectic melting point to soften the foil and thereby facilitate intimate contact between the foil and the oxide. At temperatures above 1065° C., the eutectic liquid commences to form at the foil-oxide interface. Bonding is suitably carried out at temperatures less than 1083° C., the copper melting point, to avoid melting the foil. However, it is preferred to maintain the temperature close to the eutectic melting point, preferably between 1065° C. and 1070° C., to limit dissolution of the metal, to form a liquid having a composition near the eutectic, it being understood that the actual liquid composition is dependent upon the temperature in accordance with known principles governing phase relationships.

While in the described embodiment, neat copper metal was deposited to form the cuprous oxide film, the deposit may also include additives, such as calcium and magnesium, that form oxides that enhance the bonding of the copper film. Such additives may be either codeposited with the copper or separately deposited as a thin film adjacent the copper to be incorporated within the deposit upon heating.

While this invention has been described in terms of certain examples thereof, it is not intended that it be limited to the above description but rather only to the extent set forth in the claims that follow.

We claim:

1. A method for bonding a metal foil to a nonmetallic substrate, said foil being formed of a metal reactable to produce an oxide compound and further suitable for producing in combination with said oxide compound a low melting eutectic oxide composition, said method comprising depositing a thin film of said metal onto the substrate, oxidizing the metal film to form said metal oxide compound, arranging the metal foil and the substrate such that the foil lies in contact with the oxidized deposit, heating the arrangement at a temperature above the eutectic melting point and below the metal melting point, whereupon a liquid phase forms at the interface between the metal foil and the oxidized film, continuing to heat the arrangement at a temperature above the eutectic melting point for a time sufficient to dissolve the metal oxide compound into the liquid phase, whereupon the liquid phase wets the substrate, and cooling the arrangement, whereby the liquid phase solidifies and bonds the metal foil to the substrate.

2. The method according to claim 1 wherein the metal is selected from the group consisting of chromium, iron, cobalt, nickel and copper.

3. A method for bonding a metallic copper foil to a nonmetallic substrate comprising depositing a metallic copper thin film onto the substrate, oxidizing the copper film under conditions suitable for forming cuprous oxide compound, applying a metallic copper foil to the substrate to produce an arrangement comprising the foil in intimate contact with the oxidized copper film at an interface therebetween, heating the arrangement at a temperature above the melting point of a eutectic copper oxide composition composed of about 0.34 weight percent oxygen and the balance copper, but less than the copper metal melting point, whereupon during said heating the copper metal and the oxidized deposit combine to form a liquid phase at the interface, maintaining the arrangement at a temperature above the eutectic melting point and below the copper metal melting point for a time sufficient to dissolve the oxidized film into the liquid phase, whereupon the liquid phase wets the substrate, and cooling and solidifying the liquid phase to bond the copper foil to the substrate.

4. A method for bonding a metallic copper foil to an alumina substrate comprising vapor depositing a metallic copper thin film onto the substrate, heating the copper film in contact with a suitably low oxygen atmosphere to form a cuprous oxide film, applying a metallic copper foil directly onto the cuprous oxide film to form an assembly, heating the assembly to a temperature above the melting point of a eutectic copper oxide composition composed of about 0.34 weight percent oxygen and the balance copper, and below the copper metal melting point to form a liquid phase that comprises the cuprous oxide from said film and wets the substrate, and cooling the assembly to solidify the liquid phase and thereby bond the copper foil to the substrate.

5. A method for bonding a metallic copper foil to an alumina substrate comprising vapor depositing onto the substrate a metallic copper film having a thickness between about 200 Å and 3000 Å, heating the copper film to a temperature between 800° C. and 1065° C. while exposed to an atmosphere containing oxygen at a partial pressure less than $10^{-3}$ atmosphere to react the metallic copper form a cuprous oxide film, applying a metallic copper foil directly onto the cuprous oxide film to form an assembly, heating the assembly to a temperature less than 1065° C. to soften the metallic copper foil to produce intimate contact between the foil and the cuprous oxide film, further heating the assembly to a temperature between about 1065° C. and 1083° C. to form a liquid phase derived from the cuprous oxide film in contact with the copper foil, which liquid phase wets the substrate, and cooling the assembly to solidify the liquid phase and thereby bond the copper foil to the substrate.

6. A method for bonding a metallic copper foil to an alumina substrate comprising vapor depositing onto the substrate a metallic copper thin film having a thickness between about 500 Å and 1000 Å, heating the copper film to a temperature between 900° C. and 1000° C. while exposed to an atmosphere containing oxygen at a partial pressure between about $10^{-5}$ and $10^{-3}$ atmosphere to substantially react the metallic copper to form a cuprous oxide film, applying a metallic copper foil directly onto the cuprous oxide film to form an assembly, heating the assembly in an inert atmosphere to a temperature less than about 1065° C. to soften the metallic copper foil to produce intimate contact at an interface between the copper foil and the cuprous oxide film, further heating the assembly in an inert atmosphere to a temperature between about 1065° C. and 1070° C. to form a eutectic liquid phase at the interface and to dissolve the cuprous oxide film into the liquid phase, whereupon the liquid phase wets the substrate, and cooling the assembly to solidify the liquid phase and thereby bond the copper foil to the substrate.

* * * * *